SEMICONDUCTOR SWITCH WITH ISOLATED D-C DRIVE

Filed Oct. 26, 1966

INVENTOR
RICHARD C. ENTENMANN

BY

Watson, Cole, Grindle & Watson
ATTORNEYS

United States Patent Office 3,492,505
Patented Jan. 27, 1970

3,492,505
SEMICONDUCTOR SWITCH WITH ISOLATED D-C DRIVE

Richard C. Entenmann, San Diego, Calif., assignor to Stromberg-Carlson Corporation, Rochester, N.Y., a corporation of Delaware
Filed Oct. 26, 1966, Ser. No. 589,701
Int. Cl. H03k *17/56*
U.S. Cl. 307—254 7 Claims

ABSTRACT OF THE DISCLOSURE

In a transistorized gating circuit using semi-conductors for switching power signals to a load, there is disclosed a field effect transistor circuit with two control electrodes connected to two electrodes of further transistor load control means.

Figures 1, 2:
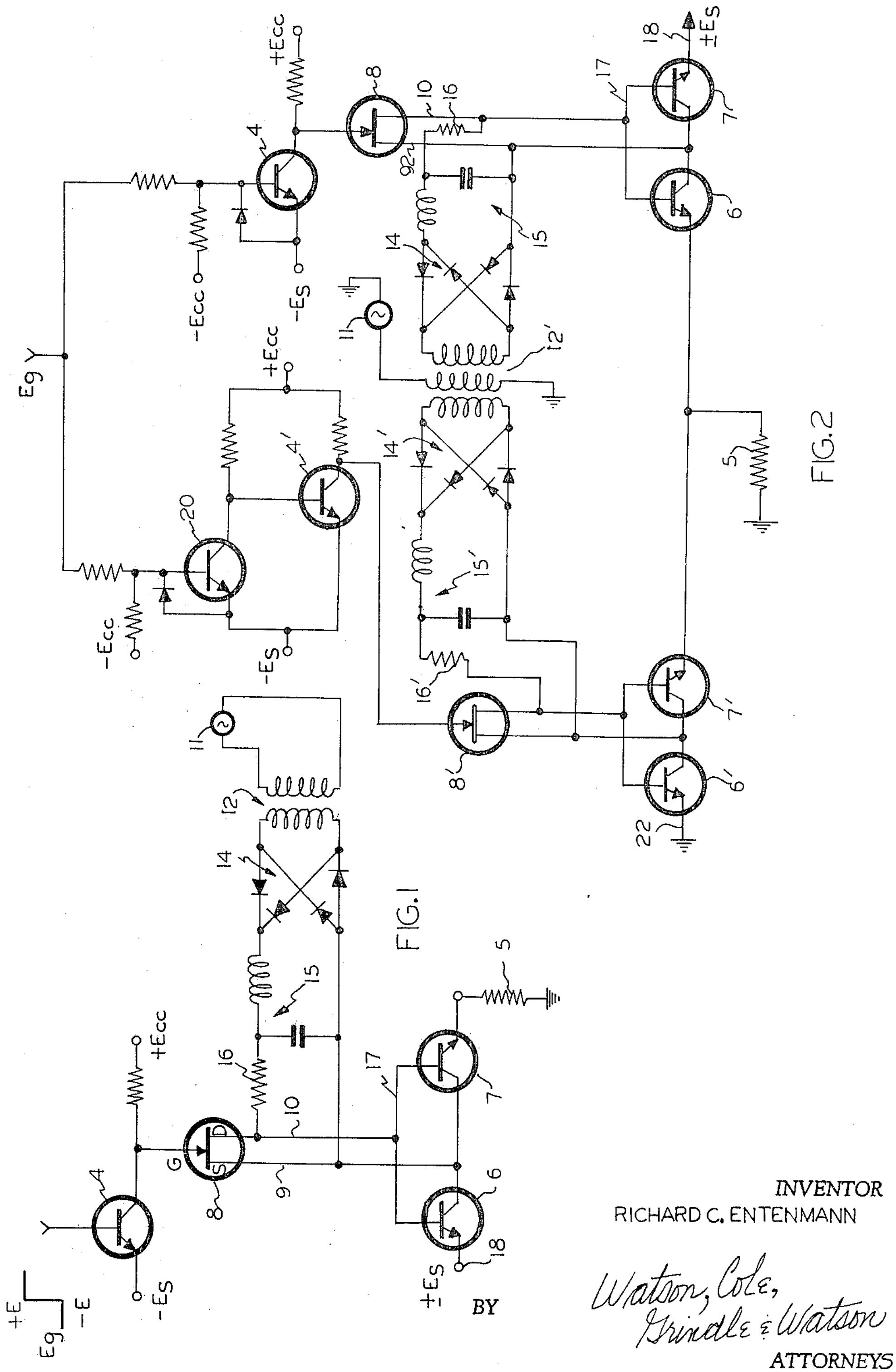

This invention relates to control circuits and, more specifically, it relates to bistable transistor gating circuits for passing signals from a power source to a load.

It has been a difficult problem in transistorized control systems to isolate switching circuits from power sources by intermediate transistor circuits which conventionally produce a relatively low inter-circuit impedance. Accordingly, it has become desirable in prior art switches to provide complex devices operating in a chopper mode in order to obtain the necessary isolation when controlling a power signal from a D-C gating signal at a transistor circuit. Some examples of these are shown in section 16.5 of the Handbook of Semiconductor Electronics, Lloyd P. Hunter, McGraw Hill, New York, 1956.

Accordingly, it is an object of this invention to provide an improved bistable circuit which continuously controls the presence or absence of a power signal by means of a non-chopped direct coupled transistor switch which is effectively isolated from a power source.

A further object of the invention is to provide an efficient gating control circuit which introduces little resistance into the power supply circuit when it is coupled to deliver power to the load.

Another object of the invention is to provide a circuit with a D-C operation mode for selectively coupling power from a A-C source to a load circuit.

Still another object of the invention is to provide a gated power control circuit for bilaterally passing current from a single D-C source in either polarity to a load.

Accordingly, there is provided by this invention a switching transistor circuit which is isolated from a transistor load control circuit by an intermediate field effect transistor or equivalent device operating in the same manner. Thus, the field effect transistor circuit serves either to absorb the power from the source or to convey it to the load control circuit dependent upon the state of the switching transistor circuit.

One embodiment of the invention comprises two such switches connected in complementary drive configuration so that one switch is always in the "on" condition and the other in the "off" condition.

Further features and objects of the invention are set forth in the following more detailed specification with reference to the accompanying drawings, wherein:

FIGURE 1 is a schematic circuit diagram of a gating circuit provided in accordance with the invention; and FIGURE 2 is a schematic circuit diagram of a complementary drive embodiment of the invention.

Now the basic circuit configuration of FIGURE 1 may be considered, where a gating transistor 4 attains either of two stable conductive levels in response to input gating signal level changes E*g* to thereby control a load 5 by medium of a pair of load control transistors 6, 7 such as type 2N2219 or the equivalent single integrated circuit 3N114 (sprague) and a field effect transistor 8 such as Motorola type MM2102. It is noted either NPN or PNP transistors can be used with conventional polarity changes but load control transistors 6, 7 are of the same polarity.

A source of gating power is coupled to the two controlled electrodes 9, 10 of the field effect transistor 8, and in this instance is derived from the source 11 of an A-C carrier wave of a frequently such as 20 kilocycles. The transformer 12 has low interwinding capacity and couples the cources to full wave rectifier 14 and filter 15 to provide a filtered D-C potential of about 10 volts amplitude. Resistor 16 delivers to the base circuits 17 of the load control transistors 6, 7 a drive current of about 10 milliamperes to switch on the power of either polarity plus/minus E*s* at terminal 18 to drive the load 5 when the field effect transistor 8 is at high impedance.

It is noted that the power source is effectively isolated from the gating control signals since the leakage current through the field effect transistor 8 is in the nanoampere region. Also, the operation of transistors 6, 7 in the inverted mode further high impedance isolation, and further permits gating of signals of opposite polarities because of the load connection between the two emitter electrodes of the load control circuit transistor pair 6, 7.

Full control is maintained by means of a direct coupled signal path, and with a D-C gating power source that elimates need for chopper mode of operation.

The embodiment of FIGURE 2 has two such gates or switches operable in complementary drive mode so that one switch is always on when the other is off. To effect this the left hand switch section marked with primed reference characters has an inverter transistor 20 connected to the gating signal source E*g*. Thus, whenever the switching transistor 4 is on the complementary switching transistor 4' is off and vice versa. Correspondingly, whenever one field effect transistor 8 is on to effectively short circuit the bases and collectors of the load control transistors 6, 7, the complementary field effect transistor 8' is off serving to present a high impedance between bases and collectors of load control transistors 6', 7' and thus connecting only the grounded power terminal 22 to the load 5. Accordingly, it is seen that the load 5 can be alternately switched or clamped to two different voltages or voltage levels such as minus E*s* or plus E*s* and ground as illustrated while under control of the input bilevel D-C gating signal E*g*.

It is therefore evident that this invention has provided an improved and novel non-chopped D-C gating device with isolated direct current drive that achieves the various objects. Accordingly, those features of novelty believed descriptive of the scope and nature of the invention are defined in combination in the accompanying claims.

What is claimed is:

1. A transistor controlled gating circuit configuration comprising in combination, a switching transistor circuit coupled to a source of gating signals establishing two output control signal levels, a field effect transistor with a control electrode and two controlled electrodes having its control electrode coupled for operation by said switching transistor circuit at the output signal levels to two corresponding states with respective low and high impedances established between the two controlled electrodes, a gating power source with a pair of terminals coupled to said two controlled electrodes, a load power source, and a load control circuit comprising transistor means having two electrodes connected respectively to each of said two controlled electrodes to thereby receive the power from said load power source when the impedance between the two controlled electrodes is in its high state under control of said switching transistor circuit.

2. A gating circuit as defined in claim 1 wherein the load control circuit comprises a pair of transistors having emitter base and collector electrodes operated in inverted mode with common base and collector electrodes connected to said two controlled electrodes of the field effect transistor and providing a load control circuit coupled in series circuit to the two emitter electrodes.

3. A gating circuit as defined in claim 2 wherein the load circuit is connected to the two emitter electrodes of the load control circuit transistor pair.

4. A gating circuit as defined in claim 1 wherein the gating power source comprises a source of A-C carrier waves and a rectifier, with a low interwinding capacity transformer coupling said source to said rectifier.

5. Two gating circuits as defined in claim 1 connected in complementary drive configuration to provide one of said two gating circuits in a low impedance state and the other in a high impedance state alternating with a change of the control signal levels.

6. A complementary drive configuration as defined in claim 5 wherein the load circuits of the two gating circuit configurations each comprise a pair of load control transistors having emitter base and collector electrodes operated in inverted mode with the base and collector electrodes connected to the respective two controlled electrodes of the field effect transistors in the respective gating circuits, and wherein the load circuit is connected to a junction between emitter electrodes of each pair of load control transistors and a datum potential point with the load power source coupled between the remaining two emitter electrodes of the load control transistor pairs.

7. A gating circuit as defined in claim 1 wherein the power source comprises a source of alternating signals having means connecting the signals in opposite polarity to said two controlled electrodes.

References Cited

UNITED STATES PATENTS 3,215,859 11/1965 Sorchych.

OTHER REFERENCES

I.B.M., Technical Disclosure Bulletin, "Floating Power Supply for Sampling Switch" by Faber, vol. 7, No. 6, November 1964, pp. 550 and 551.

I.B.M. Technical Disclosure Bulletin I "Sampling Switch" by Hoseck, vol. 7, No. 11, April 1965, pp. 1109 and 1110.

DONALD D. FORRER, Primary Examiner

B. P. DAVIS, Assistant Examiner

U.S. Cl. X.R.

307—239, 251, 279, 304